United States Patent [19]
Otani

[11] Patent Number: 5,340,793
[45] Date of Patent: Aug. 23, 1994

[54] LAYER-BY-LAYER PROCESS FOR FORMING Bi-CONTAINING OXIDE SUPERCONDUCTING FILMS

[75] Inventor: Seigen Otani, Kawasaki, Japan

[73] Assignee: Fujitsu Limited, Kawasaki, Japan

[21] Appl. No.: 853,295

[22] Filed: Mar. 18, 1992

[30] Foreign Application Priority Data

Mar. 18, 1991 [JP] Japan .................. 3-052601

[51] Int. Cl.$^5$ .......................... H01L 39/24
[52] U.S. Cl. ...................... 505/477; 505/729; 505/730; 427/62; 427/126.3; 427/419.2; 427/419.3
[58] Field of Search .................. 505/1, 730, 729; 427/62, 63, 419.2, 419.3, 126.3

[56] References Cited

FOREIGN PATENT DOCUMENTS 0426570 5/1991 European Pat. Off. .

OTHER PUBLICATIONS

Nakao et al., "Superconductivity in Bi-Sr-Ca-Cu-O Superlattices: Two-dimensional properties of CuO planes", Jpn. J. Appl. Phys. 30(12B) Dec. 1991 pp. 3929–3932.
Tsukamoto et al., "low-temperature annealing effect on Bi-Sr-Ca-Cu-O thin films prepared by layer-by-layer depositon", Jpn. J. Appl. Phys 30(5A) May 1991, pp. L830–833.
Tomoji KAWAI: "Design and Synthesis of High Tc Superconducting Superlattice by Successive Deposition Method", Bulletin of the Japan Institute of Metals, vol. 29, No. 9, (1990), pp. 733–739.
J. N. Eckstein et al., "Epitaxial Growth of High-temperature Superconducting Thin Films", J. Vac. Sci. Technol. B7(2), 1989, pp. 319–323.
H. Koinuma and M. Yoshimoto: "Development of Superfine Ceramics Chemical", Chemistry, vol. 44, No. 8, (1989), pp. 552–553.
Patent Abstracts of Japan, vol. 13, No. 46 (E-711) Feb. 2, 1989 & JP-A-63 241810 dated Oct. 7, 1988.
V. Paserin et al., "Vacuum deposition of multilayer Bi-Ca-Sr-Cu-O superconducting thin films," Applied Physics Letters, vol. 53, No. 7, Aug. 15, 1988, New York, N.Y., pp. 624–625.
J. N. Eckstein et al., "Epitaxial growth of high-temperature superconducting thin films," Journal of Vacuum Science and Technology: Part B, vol. 7, No. 2, Mar. 1989, New York, N.Y., pp. 319–323.
S. Yokoyama et al., "Atomic Layer Growth of BiSrCaCuO by Molecular Beam Epitaxy Using Ozone under UV Irradiation," Japanese Journal of Applied Physics, supplements 22nd Conference on Solid State Devices and Materials, 1990, Tokyo, Japan, pp. 929–932.
J. N. Eckstein et al., "Atomically layered heteroepitaxial growth of single-crystal films of superconducting $Bi_2Sr_2Ca_2Cu_3O_x$," Applied Physics Letters, vol. 57, No. 9, Aug. 27, 1990, New York, N.Y. pp. 931–933.

Primary Examiner—Roy V. King
Attorney, Agent, or Firm—Staas & Halsey

[57] ABSTRACT

A method of forming a Bi system copper oxide superconducting thin film of $Bi_2Sr_2Ca_{n-1}Cu_nO_x$ ($n \geq 2$) including at least the equivalent of a pair of a full CuO molecular layer and a full CaO molecular layer, by a layer-by-layer process (an atomic layer piling process) using MBE. In accordance with the method, the CuO and CaO needed for the film are deposited in a pile by alternately depositing CuO in an amount equal to a 1/m portion of a full CuO molecular layer and CaO in an amount equal to a 1/m portion of a full CaO molecular layer in a manner similar to that used for superlattice structure formation. The alternate deposition of CuO and CaO layer portions is repeated m times where m is an integral number of not less than n. During the deposition process, the deposition time of each CuO portion is X/m, where X is the depositing formation time of one full CuO molecular layer, and the deposition time of each CaO portion is Y/m, where Y is the depositing formation time of one full CuO molecular layer.

11 Claims, 6 Drawing Sheets

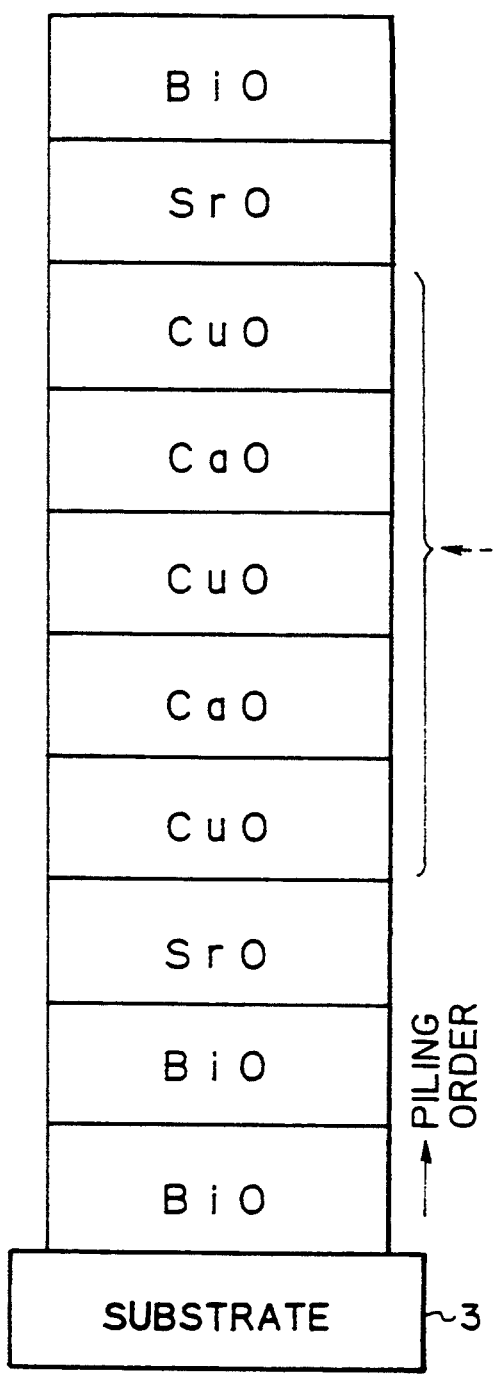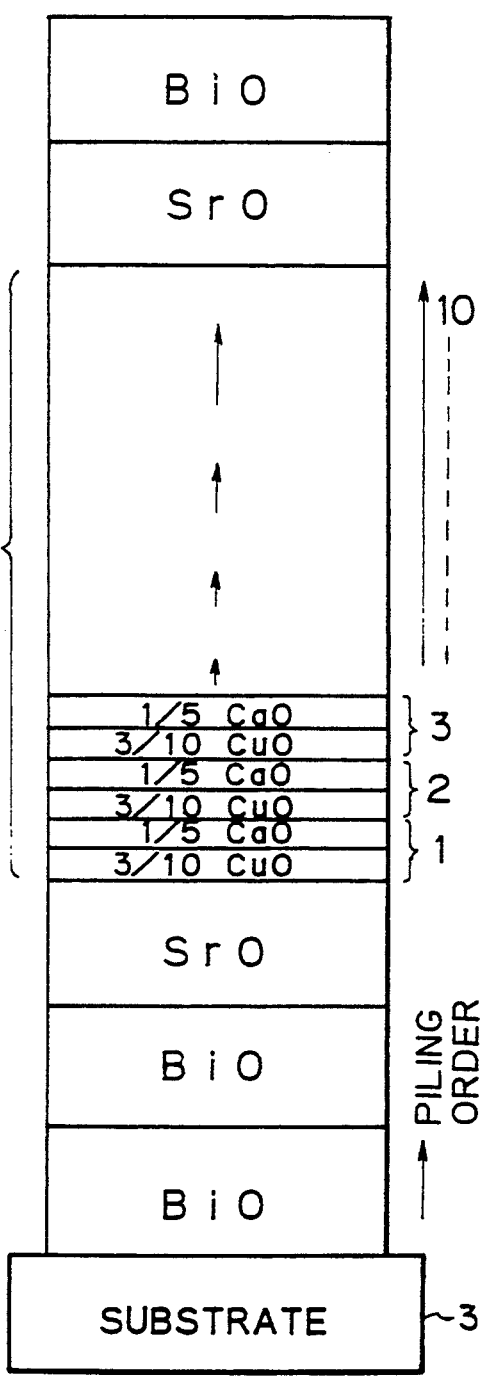

(SECOND EMBODIMENT)

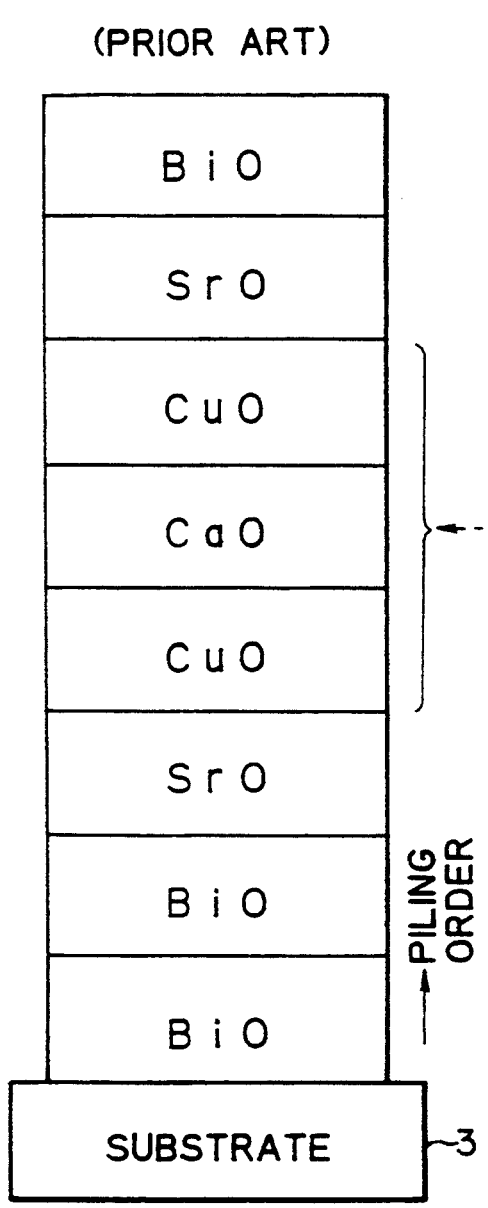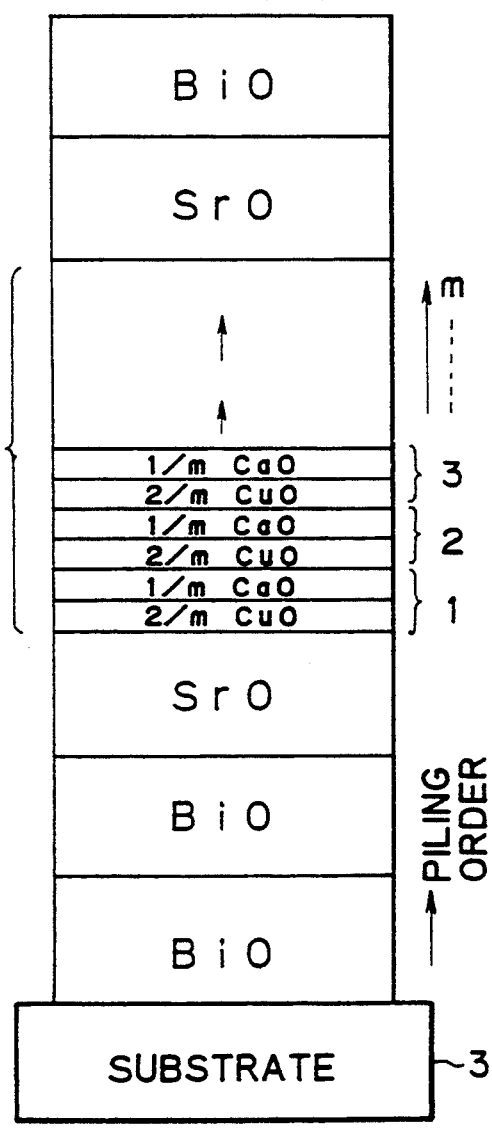

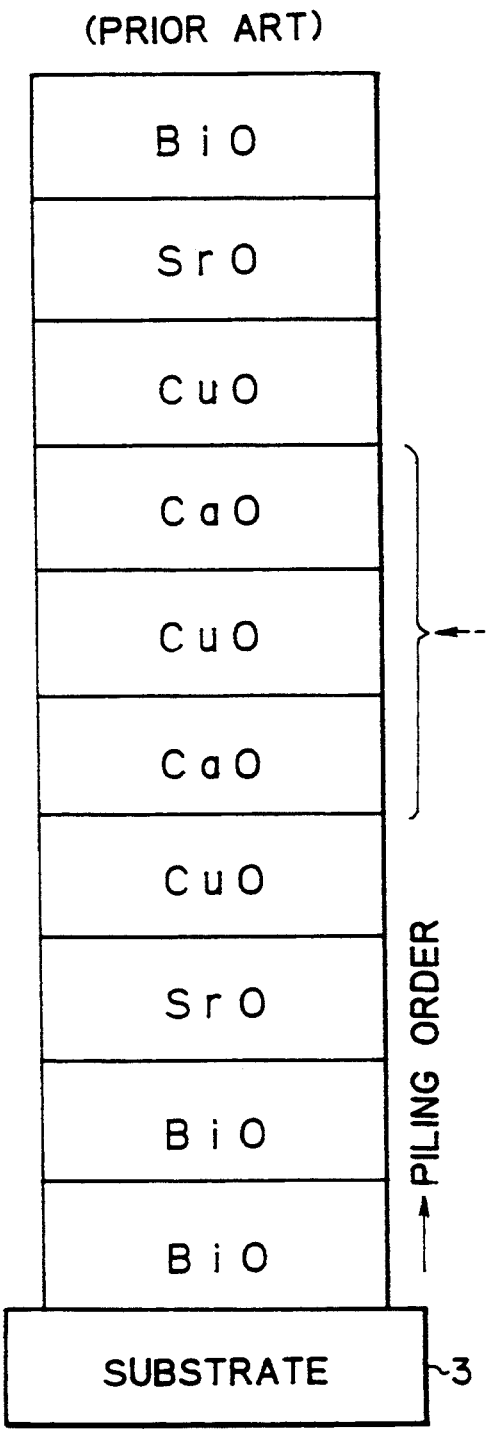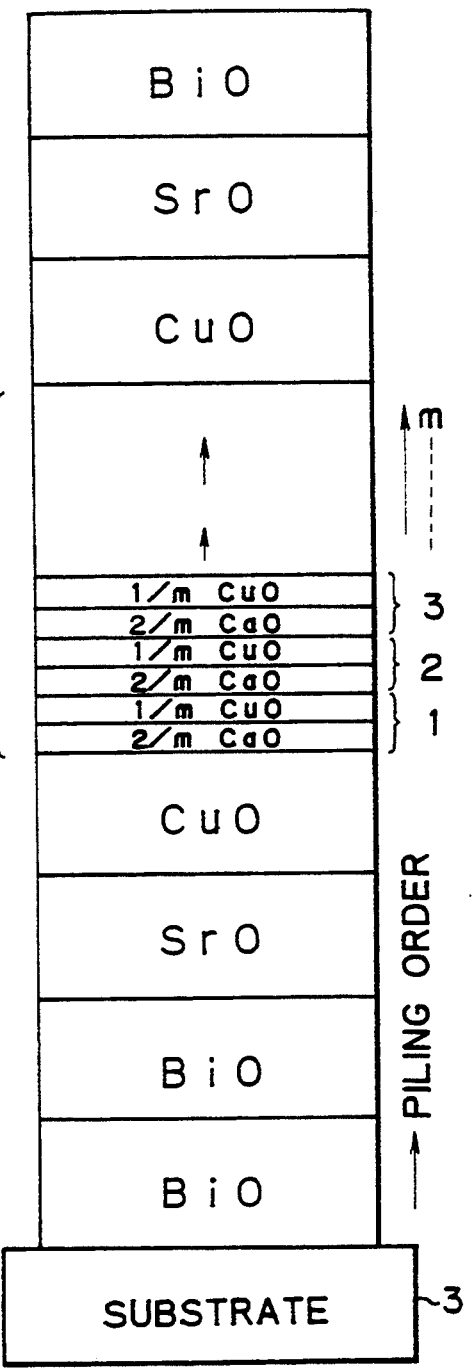

LAYER-BY-LAYER PROCESS FOR FORMING Bi-CONTAINING OXIDE SUPERCONDUCTING FILMS

BACKGROUND OF THE INVENTION

1. Field of the Invention

The present invention relates to an oxide high-temperature superconductor, and more particularly, to a Bi system copper oxide (Bi-Sr-Ca-Cu-O system) superconducting thin film and a method of forming the same.

2. Description of the Related Art

Attempts have been made to apply superconductors to devices or wirings, using the superconduction properties thereof (e.g., zero electric-conductivity), but since critical temperature (Tc) of conventional superconductors is very low, they can be used only in a liquid helium (He). Recently developed oxide superconductors, however, have a relatively high Tc, and thus can be used in a liquid nitrogen (N). Furthermore, an oxide high-temperature superconducting thin film can be formed by depositing oxide on a substrate using atomic layer control, and such a film formation has been studied and attempted (cf., Tomoji KAWAI: "Design and Synthesis of High Tc Superconducting Superlattice by Successive Deposition Method", Bulletin of the Japan Institute of Metals, Vol. 29, No. 9, (1990), pp. 733–739, and J. N. Eckstein et al., "Epitaxial Growth of High-temperature Superconducting Thin Films", J. Vac. Sci. Technol. B7 (2), 1989, pp. 319–323).

For example, a Bi system copper oxide superconducting thin film composed of $Bi_2Sr_2Ca_{n-1}Cu_nO_x$ is illustrated in FIGS. 5 and 6 (page 736) of the above-mentioned publication of Tomoji KAWAI, and in FIG. 1 (page 552) of H. KOINUMA and M. YOSHIMOTO: "Development of Superfine Ceramics Chemical", Chemistry, Vol. 44, No. 8, (1989), pp. 552–553.

In Bi system copper oxide superconducting thin films, it is known that a film of $Bi_2Sr_2CuO_6$ (n=1, without Ca) is flat. When "n" is 2 or more (i.e., Ca is contained in the oxide superconducting thin film), how ever the flatness of the film becomes poor and the unevenness (irregularity) of the film becomes pronounced, and depending on circumstances, precipitates of Cu and Ca appear, and as a result, the critical temperature (Tc) of the superconducting thin film is lowered. Furthermore, when such films are formed by a layer-by-layer process at an atomic layer level, it has been found that Ca grows three-dimensionally rather than two-dimensionally by an in-situ observation using RHEED (reflection high energy electron diffraction method) during the film deposition (growth). Once the uneven CaO molecular layer is formed, the CuO molecular layer deposited thereon is made uneven by the uneven surface of the CaO molecular layer, and as a result, the obtained superconducting thin film is also uneven as a whole.

SUMMARY OF THE INVENTION

An object of the present invention is to provide a method of forming a Bi system copper oxide superconducting thin film of $Bi_2Sr_2Ca_{n-1}Cu_nO_x$ ($n \geq 2$) by preventing three-dimensional growth (i.e., deposition of insular (island-like) portions of CaO) during the deposition of CaO, to thus flatten the CaO atomic (molecular) layer.

Another object of the present invention is to provide a Bi system copper oxide superconducting thin film formed by the proposed method and having a flat multilayer structure and a higher critical temperature.

The above-mentioned object and other objects of the present invention are attained by providing a method of forming a Bi system copper oxide superconducting thin film composed of $Bi_2Sr_2Ca_{n-1}Cu_nO_x$ ($n \geq 2$) using a layer-by-layer process (an atomic layer piling process) employing molecular-beam epitaxy (MBE). According to the present invention, a pile of CuO and CaO layer portions is formed by alternately depositing CuO layer portions containing CuO in an amount equal to 1/m of the CuO in the pile and CaO layer portions containing CaO in an amount equal to 1/m of the CaO in the pile. The layer portions are deposited in a manner such that a superlattice structure is formed. The process is continued until the pile contains a number (m) of pairs of sequentially deposited CuO and CaO layer portion, m being an integral number of not less than n.

In accordance with the present invention it has been found that, if a CuO deposition is made to thereby grow a CuO deposited portion on a CaO deposited portion that is less than a full CaO molecular layer, the three-dimensional CaO growth can be prevented. Therefore, the necessary CaO molecular deposit is divided into a plurality of CaO deposited portions and the necessary CuO molecular deposit is divided into a plurality of CuO deposited portions; the CaO deposited portions and the CuO deposited portions being alternately deposited at cycle times (m), so that both of the CaO and CuO molecular layers are flatly (two-dimensionally) grown to thereby obtain a flat oxide superconducting thin film.

Preferably, the deposition time of the CuO is X/m, where X is the depositing formation time of a full CuO molecular layer, and the deposition time of the CaO is Y/m, where Y is the depositing formation time of a full CuO molecular layer.

Preferably, the cycle number (m) per one CaO molecular layer is 2 to 10(2, 3, 4, . . . 9, or 10), as when the cycle number is more than 10, the flattening effect is not further improved.

BRIEF DESCRIPTION OF THE DRAWINGS

The present invention will be more apparent from the description of the preferred embodiments and comparative examples set forth below, with reference to the accompanying drawings, in which:

FIG. 2a is a schematic sectional view of a conventional $Bi_2Sr_2Ca_2Cu_3O_x$ superconducting thin film formed on a substrate under an atomic layer control condition in accordance with a conventional method;

FIG. 2b is a schematic sectional view of a $Bi_2Sr_2Ca_2Cu_3O_x$ superconducting thin film formed on a substrate under an atomic layer control condition in accordance with a first embodiment of the present invention method;

FIG. 5a is a schematic sectional view of a conventional Bi$_2$Sr$_2$CaCu$_2$O$_x$ superconducting thin film formed in accordance with a conventional method;

FIG. 5b is a schematic sectional view of a Bi$_2$Sr$_2$CaCu$_2$O$_x$ superconducting thin film formed in accordance with a third embodiment of the present invention method;

FIG. 6a is a schematic sectional view of a conventional Bi$_2$Sr$_2$Ca$_2$Cu$_3$O$_x$ superconducting thin film formed in accordance with a conventional method;

FIG. 6b is a schematic sectional view of a Bi$_2$Sr$_2$Ca$_2$Cu$_3$O$_x$ superconducting thin film formed in accordance with a fourth embodiment of the present invention method;

DESCRIPTION OF THE PREFERRED EMBODIMENTS

Figure 1:
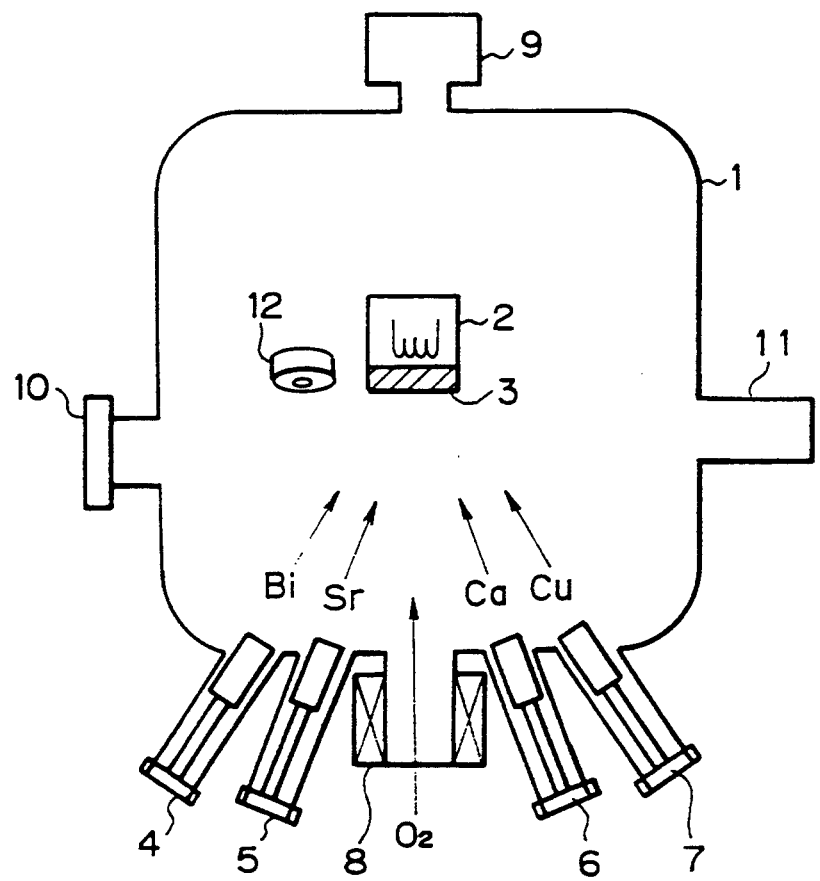
FIG. 1 is a schematic view of a conventional MBE apparatus.

Referring to FIG. 1, a conventional MBE apparatus comprises a vacuum (growth) chamber 1, a substrate holder 2 with a heater, Knudsen cells 4 to 7 for Bi, Sr, Ca and Cu, respectively, and an electron cyclotron resonance (ECR) device 8 for generating oxygen plasma. The MBE apparatus is provided with a quadru mass spectrometer (QMS) 9, a reflection high-energy electron diffraction (RHEED) screen 10, an electron gun 11 for the RHEED, and a thickness monitor 12 of a quartz oscillator. A substrate (of MgO or SrTiO$_3$) 3 is set on the holder 2. Bi-Sr-Ca-Cu-O system superconducting thin films are formed (deposited) on the substrate 3 by using the above-mentioned MBE apparatus.

First Case

Bi system copper oxide superconducting thin films of Bi$_2$Sr$_2$Ca$_2$Cu$_3$O$_x$ (2-2-2-3 composition) are formed as follows.

The vacuum chamber 1 is evacuated to attain a vacuum pressure (oxygen partial pressure) of $2 \times 10^{-5}$ to $8 \times 10^{-5}$ Torr, and the substrate (MgO single crystalline plate) 3 is heated at a temperature of 600° to 800° C. As shown in FIGS. 2a and 2b, two BiO molecular layers are deposited on the substrate 3 by allowing a bismuth beam from the cell 4 to impinge on the substrate 3 and by simultaneously feeding an oxygen plasma beam from the ECR device 8 to the substrate 3. Thereafter, while maintaining the oxygen plasma beam, a strontium beam from the cell 5 is fed to deposit a SrO molecular layer on the BiO layers.

In accordance with a conventional method, as shown in FIG. 2a, during the oxidizing by the oxygen plasma beam from the ECR device 8, a copper beam from the cell 7 and a calcium beam from the cell 6 are alternately fed to thereby pile (deposit) three CuO molecular layers alternating with two CaO molecular layers, one on top of the other, at a substrate temperature of 750° C. and growing (deposition) times of one CuO molecular layer and one CaO molecular layer of 120 seconds and 90 seconds, respectively; i.e., the composite growth times of the three CuO molecular layers and the two CaO molecular layers are 360 seconds and 180 seconds, respectively.

In accordance with a first embodiment of the method of the present invention, as shown in FIG. 2b, a cycle of a CuO deposition and a CaO deposition is repeated ten times by alternately feeding the copper beam from the cell 7 and the calcium beam from the cell 6 and continuously oxidizing the copper and calcium with the oxygen plasma from the ECR device 8, to thereby deposit full molecular layers of CuO and two full molecular layers of CaO as a whole. In this case, the deposition time of one CuO deposited portion (a 3/10 molecular layer) is 36 seconds (360s/10cycles = 36 s/cycle), and a deposition time of one CaO deposited portion (a 1/5 molecular layer) is 18 seconds (180s/10cycles = 18 s/cycle).

Thereafter, as shown in FIGS. 2a and 2b, during the oxidizing by the oxygen plasma beam from the ECR device 8, a strontium beam from the cell 5 and a bismuth beam from the cell 4 are fed in sequence to pile one SrO molecular layer and one BiO molecular layer on the formed CuO molecular layer portion (FIG. 2a) and the formed 1/5 CaO molecular layer (FIG. 2b), respectively, whereby a half-unit cell of Bi$_2$Sr$_2$Ca$_2$Cu$_3$O$_x$ (2-2-2-3) is formed. This successive deposition process is repeated until the formation of a Bi system copper oxide (Bi$_2$Sr$_2$Ca$_2$Cu$_3$O$_x$) superconducting thin film having a multilayer structure is completed.

In the above-mentioned formation process, the Bi Knudsen cell 4, Sr Knudsen cell 5, Ca Knudsen cell 6, and Cu Knudsen cell 7 are heated at 700° C., 740° C., 550° C., and 1080° C., respectively, the ECR device 8 has a microwave power of 100 W and an accelerated voltage of 0.5 kV, and the substrate bias voltage is 0.5 kV.

Figure 3:
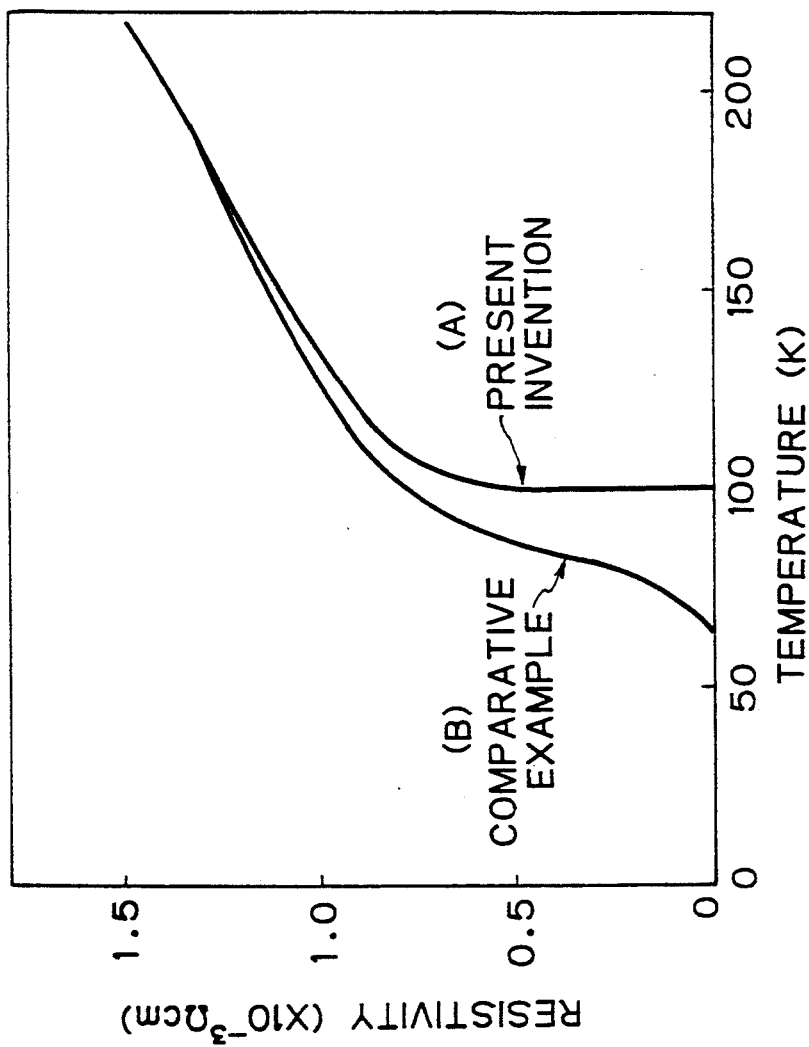
FIG. 3 is a graph showing the relationship between the resistivity of the $Bi_2Sr_2Ca_2Cu_3O_x$ superconducting thin films (of FIGS. 2a and 2b) and temperature.

The obtained Bi$_2$Sr$_2$Ca$_2$Cu$_3$O$_x$ superconducting thin films are cooled with a liquid hydrogen, and an electrical resistivity of the films is measured, to thus obtain the results as shown in FIG. 3, wherein curve A indicates the thin film (FIG. 2b) formed in accordance with the present invention and curve B indicates the thin film (FIG. 2a) formed in accordance with a conventional process.

As is clear from FIG. 3, the Bi$_2$Sr$_2$Ca$_2$Cu$_3$O$_x$ superconducting thin film according to the present invention has a critical temperature (Tc) of 100 K, which is higher than that (65K) of the conventional type Bi$_2$Sr$_2$Ca$_2$Cu$_3$O$_x$ superconducting thin film.

Second Case

Bi system copper oxide superconducting thin films of Bi$_2$Sr$_2$CaCu$_2$O$_x$ (2-2-1-2) (n=2) are formed as follows.

Figure 4A:
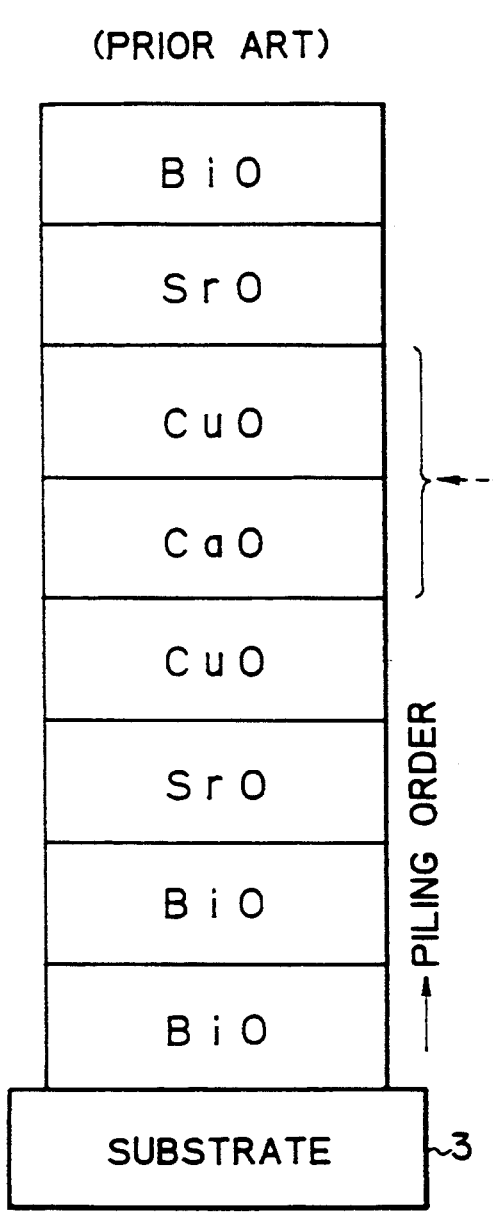
FIG. 4a is a schematic sectional view of a conventional $Bi_2Sr_2CaCu_2O_x$ superconducting thin film formed in accordance with a conventional method.
Figure 4B:
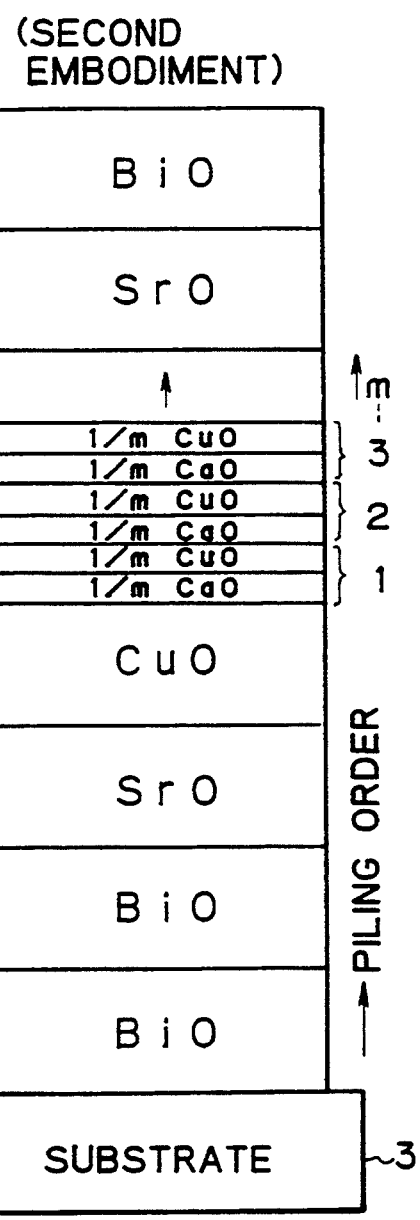
FIG. 4b is a schematic sectional view of a $Bi_2Sr_2CaCu_2O_x$ superconducting thin film formed in accordance with a second embodiment of the present invention method.

As shown in FIGS. 4a and 4b, two BiO layers are deposited on the substrate 3 and one SrO molecular layer is deposited on the BiO layers, in the same manner as used in the first case, and thereafter, a full CuO molecular layer is formed on the SrO layer by feeding a copper beam from the cell 7 and the oxygen plasma from the ECR device 8.

In accordance with a conventional method, as shown in FIG. 4a, during the oxidizing by the oxygen plasma beam from the ECR device 8, a calcium beam from the cell 6 and a copper beam from the cell 7 are fed in sequence to pile (deposit) a pair of one full CaO molecular layer and one full CuO molecular layer on the formed CuO molecular layer.

In accordance with a second embodiment of the method of the present invention, as shown in FIG. 4b, a cycle of a CaO deposition and a CuO deposition is repeated "m" times by alternately feeding the calcium beam from the cell 6 and the copper beam from the cell 7, and continuously oxidizing the calcium and copper with the oxygen plasma from the ECR device 8, to thereby deposit the same amounts of CaO and CuO as would be present in a pair of the full CaO and CuO molecular layers. In this case, a deposition time of one CaO deposited portion (a 1/m molecular layer) is Y/m, wherein Y is the deposition time of the full CaO molecular layer and a deposition time of one CuO deposited portion (a 1/m molecular layer) is X/m, wherein X is the deposition time of the full CuO molecular. Note, "m" is not more than 10, and preferably is 4 or 5.

Thereafter, as shown in FIGS. 4a and 4b, during the oxidizing by the oxygen plasma beam, a strontium beam from the cell 5 and a bismuth beam from the cell 4 are fed in sequence to pile one SrO molecular layer and one BiO molecular layer on the formed CuO molecular layer (FIG. 4a) and the formed 1/m CuO molecular layer portion (FIG. 4b), respectively. Accordingly, a half-unit cell of $Bi_2Sr_2CaCu_2O_x$ (2-2-1-2) is formed, and this successive deposition process is repeated until the formation of the Bi system copper oxide ($Bi_2Sr_2CaCu_2O_x$) superconducting thin film having a multilayer structure is completed.

The obtained $Bi_2Sr_2CaCu_2O_x$ superconducting thin film (FIG. 4b) formed in accordance with the second embodiment of the present invention method has a multilayer structure flatter than that of the obtained thin film (FIG. 4a) formed in accordance with a conventional method, and has a critical temperature higher than that of the conventional thin film.

Third Case

Bi system copper oxide superconducting thin films of $Bi_2Sr_2CaCu_2O_x$ (2-2-1-2) (n=2) are formed as follows.

As shown in FIGS. 5a and 5b, two BiO molecular layers are deposited on the substrate 3 and one SrO molecular layer is deposited on the BiO layers in the same manner as that used in the first case.

In accordance with a conventional method, as shown in FIG. 5a (the same as FIG. 4a), during the oxidizing by the oxygen plasma beam from the ECR device 8, a copper beam from the cell 7, a calcium beam from the cell 6 and a copper beam from the cell 7 are fed sequentially to pile (deposit) a full CuO molecular layer and a pair of layers comprising one full CaO molecular layer and one full CuO molecular layer on the formed SrO molecular layer.

In accordance with a third embodiment of the method of the present invention, as shown in FIG. 5b, a cycle of a CuO deposition and a CaO deposition is repeated "m" times by alternately feeding the copper beam from the cell 7 and the calcium beam from the cell 6 and continuously oxidizing the copper and calcium with the oxygen plasma from the ECR device 8, to thereby deposit amounts of CaO and CuO equal to two full CaO molecular layers and one full CuO molecular layer. In this case, a deposition time of one CuO deposited portion (a 2/m molecular layer) is 2X/m, wherein X is a deposition time of the full CuO molecular layer, and a deposition time of one CaO deposited portion (a 1/m molecular layer) is Y/m, wherein Y is a deposition time of the full CaO molecular. Note, "m" is not more than 10, and preferably is 4 or 5.

Thereafter, as shown in FIGS. 5a and 5b, during the oxidizing by the oxygen plasma beam, a strontium beam from the cell 5 and a bismuth beam from the cell 4 are fed in sequence to pile one SrO molecular layer and one BiO molecular layer on the formed CuO molecular layer (FIG. 5a) and the formed 1/m CaO molecular layer portion (FIG. 5b), respectively, whereby a half-unit cell of $Bi_2Sr_2CaCu_2O_x$ (2-2-1-2) is formed. This successive deposition process is repeated until the formation of the Bi system copper oxide ($Bi_2Sr_2CaCu_2O_x$) superconducting thin film having a multilayer structure is completed.

The obtained $Bi_2Sr_2CaCu_2O_x$ superconducting thin film (FIG. 5b) formed in accordance with the third embodiment of the present invention method has a multilayer structure flatter than that of the obtained thin film (FIG. 5a) formed in accordance with a conventional method, and has a critical temperature higher than that of the conventional thin film.

Fourth Case

Bi system copper oxide superconducting thin films of $Bi_2Sr_2Ca_2Cu_3O_x$ (2-2-2-3) (n=3) are formed as follows.

As shown in FIGS. 6a and 6b, two BiO molecular layers are deposited on the substrate 3 and one SrO molecular layer on the BiO layers in the same manner as that used in he first case, and thereafter a full CuO molecular layer is formed on the SrO layer by feeding a copper beam from the cell 7 and the oxygen plasma from the ECR device 8.

In accordance with a conventional method, as shown in FIG. 6a (the same as FIG. 2a), during the oxidizing by the oxygen plasma beam from the ECR device 8, a calcium beam from the cell 6, a copper beam from the cell 7, and a calcium beam from the cell 6 are fed sequentially to pile (deposit) two full CaO molecular layers and one full CuO molecular layer of the formed SrO molecular layer.

In accordance with a fourth embodiment of the method of the present invention, as shown in FIG. 6b, a cycle of a CaO deposition and a CuO deposition is repeated "m" times by alternately feeding the calcium beam from the cell 6 and the copper beam from the cell 7 and continuously oxidizing the calcium and copper with the oxygen plasma from the ECR device 8, to thereby deposit amounts of Cao and CuO equal to the two full CaO molecular layers and one full CuO molecular layer. In this case, a deposition time of one CaO deposited portion (a 2/m molecular layer) is 2Y/m, wherein Y is a deposition time of the full CaO molecular layer, and a deposition time of one CuO deposited portion (a 1/m molecular layer) is X/m, wherein X is a deposition time of the full CuO molecular. Note, "m" is not more than 10, and preferably is 4 or 5. If n is larger than 3, at least one pair of one CuO molecular layer and one CaO molecular layer can be included in such a superlattice structure. A deposition time of one CaO deposited portion (a (n−1)/m molecular layer) is (n−1)Y/m, wherein Y is a deposition time of the CaO molecular layer, and a deposition time of one CuO deposited portion (a (n−2)/m molecular layer) is (n−2)X/m, wherein X is a deposition time of the CuO molecular. Note, "m" is not less than 2(n−1).

Thereafter, as shown in FIGS. 6a and 6b, during the oxidizing by the oxygen plasma beam from the ECR device 8, a copper beam from the cell 7, a strontium beam from the cell 5 and a bismuth beam from the cell 4 are fed in sequence to pile one full CuO molecular layer, one SrO molecular layer, and one BiO molecular layer on top of the formed CaO molecular layer (FIG. 6a) and the formed 1/m CuO molecular layer portion (FIG. 6b), respectively, whereby a half-unit cell of $Bi_2Sr_2Ca_2Cu_3O_x$ (2-2-2-3) is formed. This successive deposition process is repeated until the formation of the Bi system copper oxide ($Bi_2Sr_2Ca_2Cu_3O_x$) superconducting thin film having a multilayer structure is completed.

The obtained $Bi_2Sr_2Ca_2Cu_3O_x$ superconducting thin film (FIG. 5b) formed in accordance with the fourth embodiment of the present invention method has a multilayer structure flatter than that of the obtained thin film (FIG. 5a) formed in accordance with a conventional method, and has a critical temperature higher than that of the conventional thin film.

According to the present invention, during the CaO deposition of one full molecular CaO layer of the Bi system copper oxide superconducting thin layer, the CaO deposition is repeatedly interrupted with CuO deposition steps to divide the molecular CaO layer into a plurality of CaO deposited portions and to form a plurality of CuO deposited portions. Each of the CaO deposited portions locally covers an exposed surface and then, as a whole, the portions constitute one full molecular CaO layer. Accordingly, the CaO molecular layer can be two-dimensionally grown (deposited), and thus the obtained superconducting thin layer is flat and has a relatively high critical temperature Tc.

It will be obvious that the present invention is not restricted to the above-mentioned embodiments and that many variations are possible for persons skilled in the art without departing from the scope of the invention. For example, it is possible to use a metal-organic (MO-) MBE process instead of the MBE process.

I claim:

1. In a layer-by-layer process for forming a Bi system copper oxide superconducting film, composed of $Bi_2Sr_2Ca_{n-1}Cu_n$ oxide, wherein $n \geq 2$, and comprising a base structure of a substrate having at least a BiO molecular layer and an SrO molecular layer deposited in succession thereon, the improvement comprising:

sequentially depositing, on the base structure, a CuO molecular layer portion and a CaO molecular layer portion in a manner to form a pair of CuO and CaO molecular layer portions having a superlattice structure; and repeating said sequential depositing step a sufficient number of times to produce a pile of a total of m pairs of CuO and CaO molecular layer portions, wherein m is an integral number and $m \geq n$, each of said CuO molecular layer portions thereby containing an amount of CuO equal to 1/m of the total amount of CuO in said pile, and each of said CaO molecular layer portions thereby containing an amount of CaO equal to 1/m of the total amount of CaO in said pile.

2. A process as set forth in claim 1, wherein the depositing time $T_{Ca}$ for depositing the CaO molecular layer portion in each said pair equals 1/m of the total depositing time necessary to deposit the total amount of CaO in said pile and the depositing time $T_{Cu}$ for depositing the CuO molecular layer portion in each said pair equals 1/m of the total depositing time necessary to deposit the total amount of CuO in said pile.

3. A process as set forth in claim 2, wherein $n=2$ and the base structure further comprises a CuO molecular layer deposited on the SrO molecular layer thereof, and said pile of said pairs of CaO and CuO molecular layer portions is formed on said CuO molecular layer of the base structure by alternately depositing said CaO and CuO molecular layer portions of each said pair thereof during respective cycle times $T_{Ca}$ and $T_{Cu}$.

4. A process as set forth in claim 2, wherein $n \geq 3$ and the base structure further comprises a CuO molecular layer deposited on the SrO molecular layer thereof, said pile of said pairs of CaO and CuO molecular layer portions is formed on said CuO molecular layer of said base structure and another CuO molecular layer is formed on said pile of said pairs of CaO and CuO molecular layer portions.

5. A process as set forth in claim 1, wherein said film is composed of $Bi_2Sr_2Ca_2Cu_3$ oxide.

6. A process as set forth in claim 1 wherein $n=2$ and thus the total amount of CuO in said pile is equal to the amount of CuO in two CuO molecular layers and the total amount of CaO in said pile is equal to the amount of CaO in one CaO molecular layer.

7. A process as set forth in claim 4 wherein $n=2$ and thus the total amount of CaO in said pile is equal to the amount of CaO in two CaO molecular layers and the total amount of CuO in said pile is equal to the amount of CuO in one CuO molecular layer.

8. A process as set forth in claim 1 wherein $n \geq 3$ and thus the total amount of CuO in said pile is equal to the amount of CuO in three CuO molecular layers and the total amount of CaO in said pile is equal to the amount of CaO in two CaO molecular layers.

9. A process as set forth in claim 8 wherein $T_{Cu}$ and $T_{Ca}$ are the respective depositing times required for forming the CuO and CaO molecular layer portions of each pair and wherein $T_{Cu}$ equals $nX/m$, where X is the depositing time required for forming one CuO molecular layer and wherein $T_{Ca}$ equals $(n-1)Y/m$, where Y is the depositing time for forming one CaO molecular layer.

10. A process as set forth in claim 6, wherein $T_{Cu}$ and $T_{Ca}$ are the respective depositing times required for forming the CuO and CaO molecular layer portions of each pair and wherein $T_{Cu}$ equals $2X/m$, where X is the depositing time required for forming one said CuO molecular layer, and wherein $T_{Ca}$ equals $Y/m$, where Y is the depositing time for forming one said CaO molecular layer.

11. A process as set forth in claim 7, wherein $n \geq 3$ and $T_{Cu}$ equals $(n-2)X/m$, wherein X is the depositing time required for forming one said CuO molecular layer, and wherein $T_{Ca}$ equals $(n-1)Y/m$, where Y is the depositing time required for forming one said CaO molecular layer.

* * * * *

UNITED STATES PATENT AND TRADEMARK OFFICE
CERTIFICATE OF CORRECTION

PATENT NO. : 5,340,793
DATED : August 23, 1994
INVENTOR(S) : Seigen Otani

It is certified that error appears in the above-indentified patent and that said Letters Patent is hereby corrected as shown below:

```
Title page, item [56], under OTHER PUBLICATIONS, col. 2, line 2, "B_i"
should be --Bi--.
Column 1, line 3, "B_i" should be --Bi--.
Column 6, line 21, "of" should be --on--.
Column 8, "CuO" line 16, "CuO" should be --CaO--.
              line 17, "CuO" should be --CaO"--.
              line 18, "CaO" should be --CuO--.
              line 19, "CaO" should be --CuO--and "CaO" should be
              --CuO--.
```

Signed and Sealed this

Twenty-fourth Day of January, 1995

Attest:

BRUCE LEHMAN

*Attesting Officer*  *Commissioner of Patents and Trademarks*